United States Patent
Miyake et al.

(10) Patent No.: US 6,970,119 B2
(45) Date of Patent: Nov. 29, 2005

(54) ANALOG TO DIGITAL CONVERTER CIRCUIT FOR CORRECTING JUMPER LINE DETECTION ERROR

(75) Inventors: Katsuyuki Miyake, Obu (JP); Toshitaka Asai, Kariya (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 10/849,114

(22) Filed: May 20, 2004

(65) Prior Publication Data
US 2004/0254754 A1    Dec. 16, 2004

(30) Foreign Application Priority Data
Jun. 10, 2003   (JP)   ............... 2003-165111

(51) Int. Cl.$^7$ .............................. H03M 1/06
(52) U.S. Cl. ...................... 341/118; 73/23.2
(58) Field of Search ............... 341/155, 118, 120; 73/23.32, 23.2; 250/205

(56) References Cited

U.S. PATENT DOCUMENTS

| | | | |
|---|---|---|---|
| 5,466,893 A | 11/1995 | Nakatani et al. | ............ 174/250 |
| 5,777,204 A * | 7/1998 | Abe | ......................... 73/23.32 |
| 2001/0000909 A1 * | 5/2001 | Nagamatsu | ................. 250/205 |

* cited by examiner

Primary Examiner—Peggy JeanPierre
(74) Attorney, Agent, or Firm—Posz Law Group, PLC

(57) ABSTRACT

An analog to digital converter circuit included in a meter ECU detects an output voltage of a potentiometer and a source voltage outputted from a battery, and converts them to different pieces of digital data. It also detects reference voltages outputted from adjustment resistors and an adjustment battery, and converts them to different pieces of digital data. It then calculates digital data on a corrected sensor output by correcting a detection error associated with a jumper line and a voltage variation in the source voltage based on the digital data.

13 Claims, 2 Drawing Sheets

ANALOG TO DIGITAL CONVERTER CIRCUIT FOR CORRECTING JUMPER LINE DETECTION ERROR

CROSS REFERENCE TO RELATED APPLICATION

This application is based on and incorporates herein by reference Japanese Patent Application No. 2003-165111 filed on Jun. 10, 2003.

FIELD OF THE INVENTION

The present invention relates to an analog to digital converter circuit.

BACKGROUND OF THE INVENTION

An analog to digital converter circuit is used in a vehicle for converting a sensor output indicating a remaining fuel level in a tank to digital data. The converter circuit also controls a pointer instrument or a display device based on the digital data for displaying the fuel level. When the converter circuit is formed on a printed circuit board (PCB) having a jumper printed on its surface, the digital data includes a detection error associated with the jumper. Such a PCB is proposed in U.S. Pat. No. 5,466,893 (JP-B-2763951) and shown in FIG. 5.

The PCB includes a substrate 51 and a copper paste jumper 53 printed on the substrate 51. The jumper 53 is silk-printed in the form of a thin plate for electrically connecting a first land 52a with a second land 52b. The jumper 53 and the lands 52a and 52b are covered by an over coat 54 and an under coat 55 that are made of electrical insulating material.

In a silk-printing process of the jumper 53, a printed area of the jumper 53 varies between substrates. As a result, resistance of the jumper 53 varies between substrates. The variations in the resistance result in the detection error and low accuracy in the digital data conversion.

SUMMARY OF THE INVENTION

The present invention therefore has an objective to provide an analog to digital converter circuit that accurately converts sensor outputs to digital data. An analog to digital (A/D) convert circuit of the present invention includes detection means, digital conversion means, and calculation means.

The A/D converter circuit is implemented on a printed circuit board (PCB) on which a jumper line is formed by printing electrically conductive paste. The detection means detects sensor outputs indicating conditions of an object under the detection. The digital conversion means converts the sensor outputs to digital data. The calculation means calculates digital data on a corrected sensor output by correcting a detection error associated with the jumper line and included in the sensor output.

The detection means includes means for detecting at least one reference sensor output having a predetermined level in advance of the conversion of the sensor output to the digital data. The digital conversion means converts the reference sensor output to digital data. The calculation means calculates the digital data on the corrected sensor output based on the digital data on the reference sensor output. Since the detection error is removed from the sensor output, the digital data on the sensor output is calculated with accuracy. Therefore, the digital data on the conditions of the object is accurately calculated.

Furthermore, the A/D converter circuit includes first detection means and second detection means. The first detection means detects a sensor output that indicates the conditions of the object based on a source voltage outputted from a battery. The second detection means detects the source voltage. The digital conversion means converts the sensor output and the source voltage to different pieces of digital data. The calculation means calculates the digital data on a corrected senor output by correcting a detection error associated with the jumper line and a voltage variation in the source voltage and included in the sensor output.

The first and the second detection means include means for detecting a reference sensor output and a reference source voltage, respectively. They detect the reference sensor output and the source voltage in advance of the conversion of the sensor output and the source voltage to the digital data. The digital conversion means converts the reference sensor output and the reference source voltage to different pieces of digital data. The calculation means calculates the digital data on the corrected sensor output based on the digital data on the reference sensor output and the digital data n the reference source voltage.

Since the detection errors associated with the jumper line and the variation in the source voltage are removed from the sensor output, the digital data on the sensor output is calculated with accuracy. Therefore, the digital data on the conditions of the object is accurately calculated.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

The preferred embodiment of the present invention will be explained with reference to the accompanying drawings.

Figure 1:
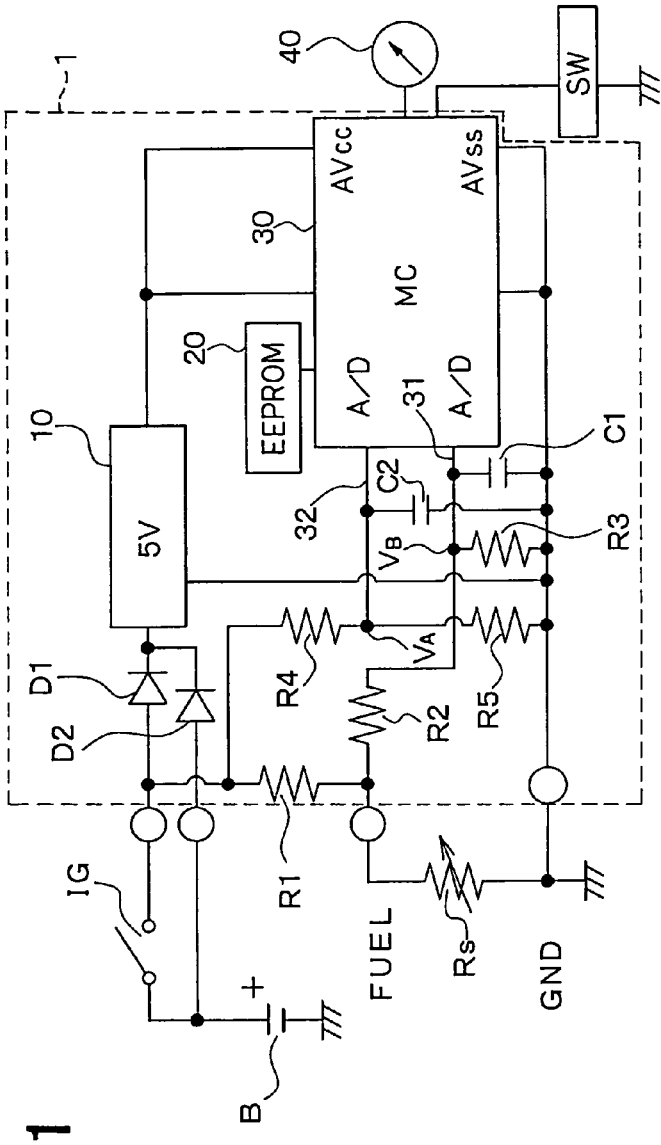
FIG. 1 is a circuit diagram of a meter electronic control unit (ECU) according to an embodiment of the present invention.
Figure 2C:
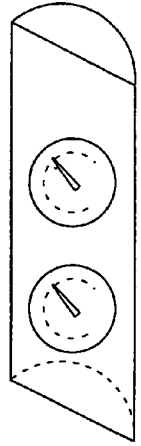
FIG. 2C is a perspective view of a meter assembly in which the meter ECU is included according to the embodiment.
Figure 2B:
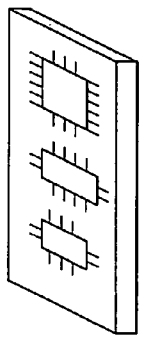
FIG. 2B is a perspective view of the substrate on which electronic components are mounted according to the embodiment.
Figure 2A:
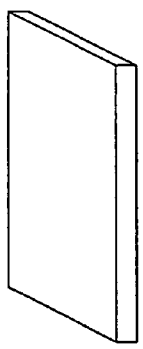
FIG. 2A is a perspective view of a substrate used in the meter ECU according to the embodiment.

Referring to FIG. 1, an analog to digital (A/D) converter circuit is used in a meter electronic control unit (ECU). The meter ECU includes resistors R1–R5, $R_S$, capacitors C1, C2, diodes D1, D2, a constant voltage circuit 10, a nonvolatile memory (EEPROM) 20, and a microcomputer 30.

The resistors R1, R2, R3 are connected in series between an output terminal of an ignition switch IG and the ground for detecting outputs of a sensor. This series circuit functions as first detection means. An input terminal of the ignition switch IG is connected with a positive terminal of an onboard battery B. A user can turn on and off the meter ECU via the ignition switch IG.

The potentiometer $R_S$, which is a variable resistor, is connected between a common connection terminal of the resistors R1 and R2 and the ground. The potentiometer $R_S$ is used as a sensor for determining a remaining fuel level in a fuel tank, namely, determining conditions of an object under the detection. The resistance of the potentiometer $R_S$ varies in synchronization with a float on the fuel surface as the fuel level varies. The fuel tank stores liquid fuel, such as gasoline, used for driving the vehicle.

An output voltage $V_B$ of the potentiometer $R_S$ measured at the common terminal of the resistors R2 and R3 is inputted to the MC 30 through an A/D terminal 31. When a voltage at an output terminal of the ignition switch IG is $V_{IG+}$ and a ratio between the resistance of the resistor R2 and that of the resistor R3 is 1:1, the voltage $V_B$ is expressed by the following expression:

$$R_S \times (V_{IG+}) / \{(R1+R_S) \times 2\}$$

The capacitor C1 is connected between the A/D terminal 31 and the ground.

The resistors R and R5 are connected in series between the output terminal of the ignition switch IC and the ground for detecting a source voltage outputted from the battery B. This series circuit functions as second detection means. A voltage $V_A$ measured at a common thermal of the resistors R4 and R5 is inputted to an A/D terminal 32 of the MC 30. The voltage $V_A$ is expressed by the following expression:

$$R5 \times (V_{IG+}) / \{(R4+R5) \times 2\}$$

The capacitor C2 is connected between the A/D terminal 32 and the ground.

The source voltage is inputted from the positive terminal of the battery B to the constant voltage circuit 10 via the diode D2 or the ignition switch IG and the diode D1. The constant voltage circuit 10 converts the source voltage to a constant voltage, for example 5V, and outputs it to the MC 30.

The MC 30 includes an A/D converter, a ROM, a RAM, and a CPU. The CPU performs calculation of digital data on the remaining fuel level based on the voltage $V_B$ and an output voltage $V_A$ of the battery B measured at a common connection terminal of R4 and R5. The CPU also performs control of a fuel gauge 40 based on the digital data. The fuel gauge 40 is a display device, including a pointer instrument and a display panel, for displaying the remaining fuel level.

The A/D converter is digital conversion means that converts the voltages $V_A$ and $V_B$ to digital data. The ROM stores data including computer programs and the RAM stores data related to processes performed by the CPU. The nonvolatile memory 20 stores correction data used for correction of detection errors associated with the jumper lines and included in outputs from the potentiometer $R_S$. An EEPROM may be used for the nonvolatile memory 20.

The PCB used in the meter ECU is a paste printed circuit board. To establish electrical connection between any two of electronic components R1–R5, C1, C2, D1, D2, 10, 20, 30, a jumper line made of conductive paste is used. Resistance of the jumper line varies between PCBs. The voltages $V_A$ and $V_B$ inputted to the MC 30 include the detection errors.

Moreover, the battery B is charged by an alternator while an engine is running. Therefore, the source voltage varies according to charging conditions of the battery B, namely a stored energy level of the battery B.

Because of the variation in the source voltage, the voltage $V_B$ includes not only the detection errors associated with the jumper resistance but also detection errors associated with the variation. To calculate the fuel level digital data with accuracy using the potentiometer $R_S$, both kinds of detection errors are required to be considered.

The meter ECU is manufactured in consideration of such errors. A method for manufacturing the meter ECU will be discussed referring to FIGS. 2A–2C and 3. A paste printed circuit board (PCB) including jumper lines is prepared. The electronic components R1–R5, C1, C2, D1, D2, 10, 20, and 30 are mounted on the PCB, and assembly of the PCB for the meter ECU is completed.

An adjustment battery $B_T$ is connected to the meter ECU. The adjustment battery $B_T$ is a tester and substitutes for the battery B. The adjustment battery $B_T$ is used as a tester in the manufacturing of the meter ECU. It outputs a predetermined constant voltage, which is a rated voltage of the battery B, from its positive terminal.

An adjustment resistor $R_{SMIN}$ is connected to the meter ECU. The adjustment resistor $R_{SMIN}$ is a tester used as a reference sensor and substitutes for the potentiometer $R_S$ for the detection error correction. The resistor $R_{SMIN}$ has the minimum resistance in the variable resistance range of the potentiometer $R_S$. Thus, a voltage $V_{BMIN}$ predetermined at the minimum level of a variable range of the output of the potentiometer $R_S$ appears at a common connection terminal of the $R_{SMIN}$ and R1.

Figure 3:
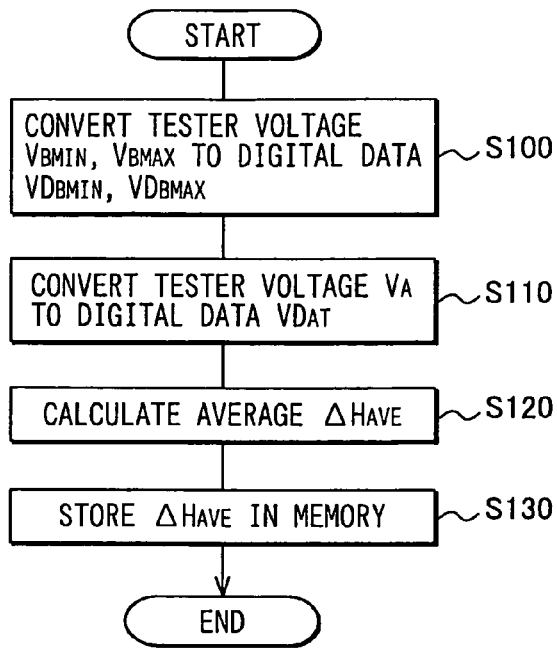
FIG. 3 is a flowchart of a part of process performed by a microcomputer (MC) included in the meter ECU according to the embodiment.

An operational switch SW is connected to the MC 30 for the detection error correction. A data correction program is executed according to operations of the switch SW performed by an operator. The program stored in the ROM is executed by the MC 30 as shown in FIG. 3. The MC 30 converts the adjustment resistor voltage (tester voltage) $V_{BMIN}$ to digital data $VD_{BMIN}$ (S100) and the voltage $V_{AT}$ to digital data $VD_{AT}$ (S110). Then, it calculates data ratio $H_{MIN}$ using the following expression:

$$H_{MIN} = VD_{BMIN} / VD_{AT} \tag{1}$$

The data ratio $H_{MIN}$ is data that contains the detection error associated with the jumper line. A data ratio $HK_{MIN}$ that is obtained by removing the detection error from the data ratio $H_{MIN}$ is stored in the ROM. The data ratio $HK_{MIN}$ is an expected value. The MC 30 calculates a difference $\Delta H_{MIN}$ between the data ratios $HK_{MIN}$ and $H_{MIN}$, namely, $HK_{MIN} - H_{MIN}$. The difference $\Delta H_{MIN}$ indicates the detection error associated with the jumper line under a condition that the resistor $R_{SMIN}$ is connected.

The adjustment resistor $R_{SMIN}$ is removed and an adjustment resistor $R_{SMAX}$ is connected to the meter ECU. The adjustment resistor $R_{SMAX}$ is a tester used as a reference sensor and substitutes for the potentiometer $R_S$ for the detection error correction. The resistor $R_{SMAX}$ has the maximum resistance in the variable resistance range of the potentiometer $R_S$. Thus, a voltage $V_{BMAX}$ predetermined at the maximum level of a variable range of the output of the potentiometer $R_S$ appears at a common connection terminal of the $R_{SMAX}$ and R1.

Completion of the connection of the adjustment resistor $R_{SMAX}$ is reported to the MC 30 through operation of the switch SW. The MC 30 converts the adjustment resistor voltage (tester voltage) $V_{BMAX}$ to digital data $VD_{DMAX}$ (S100) and the voltage $V_{AT}$ to digital data $VD_{AT}$ (S110). Then, it calculates data ratio $H_{MAX}$ using the following expression:

$$H_{MAX} = VD_{BMAX}/VD_{AT} \quad (2)$$

The data ratio $H_{MAX}$ is data that contains the detection error associated with the jumper line. A data ratio $HK_{MAX}$ that is obtained by removing the detection error from the data ratio $H_{MAX}$ is stored in the ROM. The data ratio $HK_{MAX}$ is an expected value. The MC 30 calculates a difference $\Delta H_{MAX}$ between the data ratios $HK_{MAX}$ and $H_{MAX}$, namely, $HK_{MAX} - H_{MAX}$. The difference $\Delta H_{MAX}$ indicates the detection error associated with the jumper line under a condition that the resistor $R_{SMAX}$ is connected.

The MC 30 calculates an average $\Delta H_{AVE}$ of the $\Delta H_{MAX}$ and $\Delta H_{MIN}$ using the following expression (S120):

$$\Delta H_{AVE} = \{\Delta H_{MIN} + \Delta H_{MAX}\}/2$$

Then, it writes the average $\Delta H_{AVE}$ into the nonvolatile memory 10 as correction data (S130).

After the completion of this process, electronic components including needles, display panels, and step motors are assembled to the meter ECU. Such a meter assembly is installed in a vehicle in the vehicle manufacturing process. Then, the meter ECU is connected to the potentiometer $R_S$ and the battery B.

Figure 4:
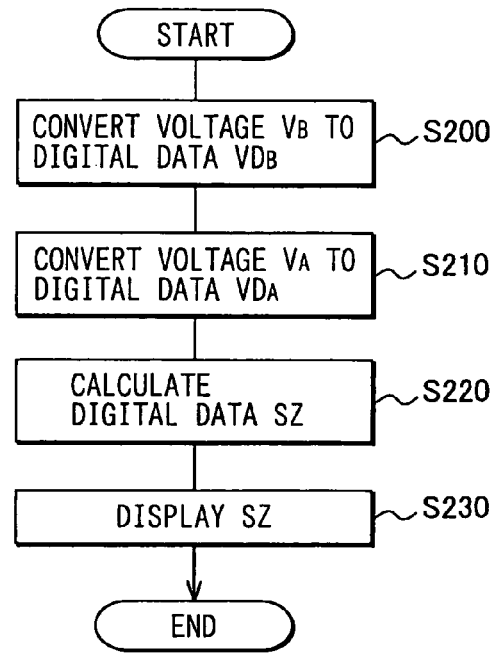
FIG. 4 is a flowchart of the rest of part of the process performed by the MC according to the embodiment.
Figure 5:
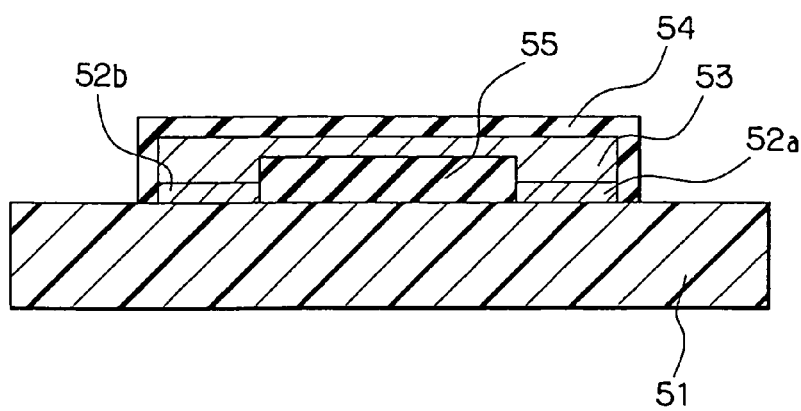
FIG. 5 is a cross-sectional view of a printed circuit board according to a related art.

When the ignition switch IG is turned on, the MC 30 starts executing a program presorted in the ROM. Steps shown in FIG. 4 are performed during the execution of the program. The MC 30 converts the voltage $V_B$ to the digital data $VD_B$ (S200) and the voltage $V_A$ to the digital data $VD_A$ (S210). Then, it calculates a data ratio H using the following expression:

$$H = VD_B/VD_A$$

The MC 30 reads the correction data $\Delta H_{AVE}$ from the memory 20 and calculates a data ratio SH by offsetting the data ratio H by the correction data $\Delta H_{AVE}$ (H−$\Delta H_{AVE}$). By offsetting the data ratio H by the correction data $\Delta H_{AVE}$, the detection error associated with the jumper line is removed. The MC 30 then calculates digital data SZ by multiplying the data ratio SH by a predetermined factor k (SH×k) (S220). The digital data SZ contains a value to be displayed for providing visual information on the remaining fuel level.

The data ratio H is a ratio between the positive terminal voltage of the battery B and the output voltage of the potentiometer $R_S$. Namely, the data ratio H always indicates the remaining fuel level regardless of the variation in the positive terminal voltage. Since the digital data SZ is calculated based on the data ratio H, it accurately indicates the remaining fuel level regardless of the variation in the positive terminal voltage. The digital data SZ is outputted to the fuel gauge 40 for displaying the remaining fuel level and the user sees the accurate remaining fuel level on the fuel gauge 40.

Since the detection errors associated with the jumper line and the variation in the source voltage are removed from the output $V_B$, the digital data on the sensor output $V_B$ is calculated with accuracy. Therefore, the digital data SZ on the remaining fuel level in the tank (the conditions of the object) is accurately calculated.

The present invention should not be limited to the embodiment previously discussed and shown in the figures, but may be implemented in various ways without departing from the spirit of the invention. For example, sensors for detecting temperatures, pressures or humidity of an onboard device (object under detection) may be used.

The meter ECU may include a constant voltage circuit for converting the source voltage to a constant voltage and applying it to the potentiometer $R_S$. In this case, the meter ECU includes a detection function, a digital conversion function, and a calculation function. The detection function is for detecting the voltage of the potentiometer $R_S$ to determine the remaining fuel level. The digital conversion function is for converting the output voltage detected by the detection function into the digital data.

Adjustment resistors (testers) $R_{SMIN}$, $R_{SMAX}$ are connected substituting for the potentiometer $R_S$. The detection function detects output voltages of the adjustment resistors $R_{SMIN}$, $R_{SMAX}$ and the digital conversion function converts the voltages to different pieces of digital data. The calculation function calculates digital data on corrected output voltages based on the converted digital data. The corrected output voltages are calculated by removing the detection errors associated with the jumper line from the output voltage of the potentiometer $R_S$. The digital data is calculated with accuracy because the corrected voltages do not contain the detection errors.

What is claimed is:

1. An analog to digital converter circuit implemented on a printed circuit board on which a jumper line is formed by printing electrically conductive paste, comprising:

detection means for detecting an output of a sensor provided for determining a condition of an object;

digital conversion means for converting the sensor output to digital data; and calculation means for calculating digital data on a corrected sensor output by correcting a detection error associated with the jumper line and included in the sensor output, wherein the detection means further detects at least one reference sensor output having a predetermined level in advance of the conversion of the sensor output to the digital data, the digital conversion means converts the reference sensor output to digital data, and the calculation means calculates the digital data on the corrected sensor output based on the digital data on the reference sensor output.

2. The analog to digital converter circuit according to claim 1, wherein:

the calculation means further includes means for calculating an average of the detection errors included in the reference sensor outputs and; and the calculation means corrects detection error included in the sensor output using the average.

3. The analog to digital converter circuit according to claim 1, wherein the calculation means further includes means for calculating digital data on an indication value based on the digital data on the corrected sensor output for providing visual information on the condition of the object.

4. The analog to digital converter circuit according to claim 1, wherein the reference sensor output is provided by a tester connected to the substitutes for the sensor for the detection error correction.

5. The analog to digital converter circuit according to claim 1, wherein the object is an onboard member used during driving a vehicle.

6. The analog to digital converter circuit according to claim 1, wherein:

the detection means detects two reference sensor outputs having different levels; and the level of the reference sensor outputs are predetermined at a minimum level and a maximum level of a variable range of the sensor output.

7. The analog to digital converter circuit according to claim 6, wherein:
the calculation means further includes means for calculating an average of the detection errors included in the reference sensor outputs and; and
the calculation means corrects detection error included in the sensor output using the average.

8. An analog to digital converter circuit implemented on a printed circuit board on which a jumper line is formed by printing electrically conductive paste, comprising:
first detection means for detecting an output of a sensor provided for determining a condition of an object based on a source voltage outputted from a battery
second detection means for detecting the source voltage;
digital conversion means for converting the sensor output and the source voltage to difference pieces of digital data; and
calculation means for calculating digital data on a corrected sensor output by correcting a detection error associated with the jumper line and a voltage variation in the source voltage and included in the sensor output, wherein
the first detection means further detects at least one reference sensor output having a predetermined level in advance of the conversion of the sensor output to the digital data,
the second detection means further detects at least one reference source voltage in advance of the conversion of the source voltage to the digital data,
the digital conversion means converts the reference sensor output and the reference source voltage to different pieces of digital data, and
the calculation means calculates the digital data on the corrected sensor output based on the digital data on the reference sensor output and the digital data on the reference source voltage.

9. The analog to digital converter circuit according to claim 8, wherein:
the first detection means detects two reference sensor outputs having different levels; and
the level of the reference sensor outputs are predetermined at a minimum level and a maximum level of a variable range of the sensor output.

10. The analog to digital converter circuit according to claim 9, wherein:
the calculation means further includes means for calculating an average of the detection errors included in the reference sensor outputs; and
the calculation means corrects detection error included in the sensor output using the average.

11. The analog to digital converter circuit according to claim 8, wherein the calculation means further includes means for calculating digital data on an indication value based on the digital data on the corrected sensor output for providing visual information on the condition of the object.

12. The analog to digital converter circuit according to claim 8, wherein the reference sensor output and the reference source voltage are provided by testers connected to substitutes for the sensor and the battery, respectively, for the detection error correction.

13. The analog to digital converter circuit according to claim 8, wherein the object is an onboard member used during driving a vehicle.

* * * * *